United States Patent
Kim et al.

(10) Patent No.: US 9,035,172 B2
(45) Date of Patent: May 19, 2015

(54) CRACK RESISTANT SOLAR CELL MODULES

(71) Applicant: SUNPOWER CORPORATION, San Jose, CA (US)

(72) Inventors: Sung Dug Kim, Pleasanton, CA (US); Nicholas Boitnott, San Francisco, CA (US)

(73) Assignee: SunPower Corporation, San Jose, CA (US)

( * ) Notice: Subject to any disclaimer, the term of this patent is extended or adjusted under 35 U.S.C. 154(b) by 253 days.

(21) Appl. No.: 13/685,441

(22) Filed: Nov. 26, 2012

(65) Prior Publication Data

US 2014/0144487 A1    May 29, 2014

(51) Int. Cl.
*H01L 31/048*    (2014.01)
*H01L 31/18*    (2006.01)

(52) U.S. Cl.
CPC .......... *H01L 31/0481* (2013.01); *H01L 31/18* (2013.01); *Y02E 10/50* (2013.01)

(58) Field of Classification Search
CPC .............................. H01L 31/048; H01L 31/18
USPC ......................................... 136/251, 252, 256
See application file for complete search history.

(56) References Cited

U.S. PATENT DOCUMENTS

| | | |
|---|---|---|
| 3,961,997 A | 6/1976 | Chu |
| 4,070,097 A | 1/1978 | Gelber et al. |
| 4,084,099 A | 4/1978 | Harvey et al. |
| 4,278,831 A | 7/1981 | Riemer et al. |
| 4,427,839 A | 1/1984 | Hall |
| 4,478,879 A | 10/1984 | Baraona et al. |
| 4,496,788 A | 1/1985 | Hamakawa et al. |
| 4,509,248 A | 4/1985 | Spitzer et al. |
| 4,665,277 A | 5/1987 | Sah et al. |
| 4,927,770 A | 5/1990 | Swanson |
| 4,939,217 A | 7/1990 | Stricklen |
| 5,030,295 A | 7/1991 | Swanson et al. |

(Continued)

FOREIGN PATENT DOCUMENTS

DE    102006048216 A1    4/2008

OTHER PUBLICATIONS

P.J. Verlinden, et al. "One-Year Comparison of a Concentrator Module with Silicon Point-Contact Solar Cell to a Fixed Flat Plate Module in Northern California", 2000, 4 sheet, Proceedings of the 16th EPSEC.

(Continued)

*Primary Examiner* — Susan D Leong
(74) *Attorney, Agent, or Firm* — Okamoto & Benedicto LLP

(57) ABSTRACT

A crack resistant solar cell module includes a protective package mounted on a frame. The protective package includes a polyolefin encapsulant that protectively encapsulates solar cells. The polyolefin has less than five weight percent of oxygen and nitrogen in the backbone or side chain. In other words, the combined weight percent of oxygen and nitrogen in any location in the molecular structure of the polyolefin is less than five. The polyolefin also has a complex viscosity less than 10,000 Pa second at 90° C. as measured by dynamic mechanical analysis (DMA) before any thermal processing of the polyolefin. The protective package includes a top cover, the encapsulant, and a backsheet. The solar cell module allows for shipping, installation, and maintenance with less risk of developing cracks on the surfaces of the solar cells.

18 Claims, 4 Drawing Sheets

(56) References Cited

U.S. PATENT DOCUMENTS

| | | | |
|---|---|---|---|
| 5,043,375 A * | 8/1991 | Henning et al. | 524/372 |
| 5,053,083 A | 10/1991 | Sinton | |
| 5,057,439 A | 10/1991 | Swanson et al. | |
| 5,066,340 A | 11/1991 | Iwamoto et al. | |
| 5,164,019 A | 11/1992 | Sinton | |
| 5,213,628 A | 5/1993 | Noguchi et al. | |
| 5,217,539 A | 6/1993 | Fraas et al. | |
| 5,266,125 A | 11/1993 | Rand et al. | |
| 5,360,990 A | 11/1994 | Swanson | |
| 5,369,291 A | 11/1994 | Swanson | |
| 5,391,235 A | 2/1995 | Inoue | |
| 5,447,576 A | 9/1995 | Willis | |
| 5,468,652 A | 11/1995 | Gee | |
| 5,512,757 A | 4/1996 | Cederstrand et al. | |
| 5,641,362 A | 6/1997 | Meier | |
| 5,660,646 A | 8/1997 | Kataoka et al. | |
| 5,726,391 A | 3/1998 | Iyer et al. | |
| 5,728,230 A | 3/1998 | Komori et al. | |
| 5,918,140 A | 6/1999 | Wickboldt et al. | |
| 6,013,582 A | 1/2000 | Ionov et al. | |
| 6,096,968 A | 8/2000 | Schlosser et al. | |
| 6,118,258 A | 9/2000 | Farine et al. | |
| 6,130,379 A | 10/2000 | Shiotsuka et al. | |
| 6,143,976 A | 11/2000 | Endros | |
| 6,147,297 A | 11/2000 | Wettling et al. | |
| 6,210,991 B1 | 4/2001 | Wenham et al. | |
| 6,262,359 B1 | 7/2001 | Meier et al. | |
| 6,274,402 B1 | 8/2001 | Verlinden et al. | |
| 6,274,404 B1 | 8/2001 | Hirasawa et al. | |
| 6,278,054 B1 | 8/2001 | Ho et al. | |
| 6,311,436 B1 | 11/2001 | Mimura et al. | |
| 6,313,395 B1 | 11/2001 | Crane et al. | |
| 6,319,596 B1 | 11/2001 | Kernander et al. | |
| 6,333,457 B1 | 12/2001 | Mulligan et al. | |
| 6,337,283 B1 | 1/2002 | Verlinden et al. | |
| 6,387,726 B1 | 5/2002 | Verlinden et al. | |
| 6,423,568 B1 | 7/2002 | Verlinden et al. | |
| 6,429,037 B1 | 8/2002 | Wenham et al. | |
| 6,465,724 B1 | 10/2002 | Garvison et al. | |
| 6,521,825 B2 | 2/2003 | Miura et al. | |
| 6,524,880 B2 | 2/2003 | Moon et al. | |
| 6,552,414 B1 | 4/2003 | Horzel et al. | |
| 6,692,985 B2 | 2/2004 | Huang et al. | |
| 6,777,610 B2 | 8/2004 | Yamada et al. | |
| 6,872,321 B2 | 3/2005 | Thavarajah et al. | |
| 6,998,288 B1 | 2/2006 | Smith et al. | |
| 7,135,350 B1 | 11/2006 | Smith et al. | |
| 7,217,883 B2 | 5/2007 | Munzer | |
| 7,238,594 B2 | 7/2007 | Fonash et al. | |
| 7,280,235 B2 | 10/2007 | Lapstun et al. | |
| 7,281,786 B2 | 10/2007 | Silverbrook | |
| 7,292,368 B2 | 11/2007 | Rozzi | |
| 7,306,307 B2 | 12/2007 | Lapstun et al. | |
| 7,306,325 B2 | 12/2007 | Silverbrook et al. | |
| 7,309,020 B2 | 12/2007 | Anderson et al. | |
| 7,322,669 B2 | 1/2008 | Berry et al. | |
| 7,322,673 B2 | 1/2008 | Silverbrook et al. | |
| 7,328,966 B2 | 2/2008 | Silverbrook | |
| 7,335,555 B2 | 2/2008 | Gee et al. | |
| 7,341,328 B2 | 3/2008 | Berry et al. | |
| 7,357,476 B2 | 4/2008 | Berry et al. | |
| 7,390,961 B2 | 6/2008 | Aschenbrenner et al. | |
| 7,468,485 B1 | 12/2008 | Swanson | |
| 7,517,709 B1 | 4/2009 | Borden | |
| 7,554,031 B2 | 6/2009 | Swanson et al. | |
| 7,633,006 B1 | 12/2009 | Swanson | |
| 7,786,375 B2 | 8/2010 | Swanson et al. | |
| 8,188,363 B2 | 5/2012 | Xavier et al. | |
| 2002/0020440 A1 * | 2/2002 | Yoshimine et al. | 136/251 |
| 2003/0070707 A1 | 4/2003 | King et al. | |
| 2003/0076649 A1 | 4/2003 | Speakman | |
| 2003/0134469 A1 | 7/2003 | Horzel et al. | |
| 2003/0178056 A1 * | 9/2003 | Hikosaka et al. | 136/251 |
| 2004/0200520 A1 | 10/2004 | Mulligan et al. | |
| 2004/0261840 A1 | 12/2004 | Schmit et al. | |
| 2005/0178428 A1 | 8/2005 | Laaly et al. | |
| 2005/0268963 A1 | 12/2005 | Jordan et al. | |
| 2006/0130891 A1 | 6/2006 | Carlson | |
| 2006/0157103 A1 | 7/2006 | Sheats et al. | |
| 2006/0196535 A1 | 9/2006 | Swanson et al. | |
| 2006/0201545 A1 | 9/2006 | Ovshinsky et al. | |
| 2007/0082206 A1 | 4/2007 | Hartig | |
| 2007/0151598 A1 | 7/2007 | De Ceuster et al. | |
| 2007/0269750 A1 | 11/2007 | Irving et al. | |
| 2008/0199690 A1 | 8/2008 | Hayes et al. | |
| 2009/0205712 A1 | 8/2009 | Cousins | |
| 2010/0047589 A1 | 2/2010 | Ochs et al. | |
| 2010/0075234 A1 | 3/2010 | Cousins | |
| 2010/0108128 A1 | 5/2010 | Chu et al. | |
| 2010/0108143 A1 | 5/2010 | Hayes | |
| 2010/0139740 A1 | 6/2010 | Xavier et al. | |
| 2010/0139764 A1 | 6/2010 | Smith | |
| 2010/0175743 A1 | 7/2010 | Gonzalez et al. | |
| 2011/0183442 A1 | 7/2011 | Oi et al. | |
| 2012/0184676 A1 | 7/2012 | Gahleitner et al. | |
| 2012/0266943 A1 | 10/2012 | Li | |

OTHER PUBLICATIONS

Richard M. Swanson, "The Promise of Concentrators", 2000, Prog. Photovolt. Res. Appl. 8, pp. 93-111 (2000), Sunpower Corporation, Sunnyvale, CA.

Ronald A. Sinton, et al. "Simplified Backside-Contact Solar Cells", Feb. 1990, pp. 348-352, IEEE Transactions on Electron Devices, vol. 37. No. 2.

Ronald A. Sinton, "Device Physics and Characterization of Silicon Point-Contact Solar Cells", Feb. 1997, pp. 1-154, Stanford Electronics Laboratories, Stanford University, CA.

Richard Roland King, "Studies of Oxide-Passivated Emitters in Silicon and Applications to Solar Cells", Aug. 1990, pp. 1-200, (Thesis) Electrical Engineering Department of Stanford University, CA.

Eric Fogarassy, et al. "Long-Pulse Excimer Laser Crystallization and Doping for the Fabrication of High Performance Polysilicon TFTs", Jan. 2006, pp. S40-S46, Journal of the Korean Physical Society, vol. 48.

Ted Kamins, "Polycrystalline Silicon for Integrated Circuit Applications" third printing 1994, pp. 198-199, Kluwer Academic Publishers, Norwell, Massachusetts.

J.Y. Lee, et al. "Boron-Back Surface Field With Spin-On Dopants by Rapid Thermal Processing", Jun. 2004, pp. 998-1001, 19th European Photovoltaic Solar Energy Conference, Paris, France.

B. Lee et al. "Thermally conductive and electrically insulating EVA composite encapsulants for solar photovoltaic (PV) cell", 2008, pp. 357-363, exPRESS Polymer Letters vol. 2, No. 5.

John Pern "Module Encapsulation Materials, Processing and Testing", 2008, 33 pages, NREL National Renewable Energy Laboratory.

Dynamic mechanical analysis—Wikipedia, the free encyclopedia, 7 sheets [retrieved on Oct. 23, 2012], retrieved from the internet: http://en.wikipedia.org/wiki/Dynamic_mechanical_analysis.

Dynamic Mechanical Analysis Basics: Part 1 How DMA Works, 2007, pp. 1-4, Technical Note Thermal Analysis, Perkin Elmer Inc., Waltham, MA.

SunPower Discovers the "Surface Polarization" Effect in High Efficiency Solar Cells, Aug. 2005, pp. 1-4, Source: SunTechnics SunReader.

R. Swanson, et al., "The Surface Polarization Effect in High-Effiency Silicon Solar Cells", submitted for publication to the 15th International Photovoltaic Science and Engineering Conference & Solar Energy Exhibition, Oct. 10-15, 2005 (4 sheets), Shanghai, China.

Jianhua Zhao, et al., "Performance Instability in N-Type Pert Silicon Solar Cells", The 3rd World Conference on Photovoltaic Energy Conversion, May 12-16, 2003 (4 sheets), Osaka, Japan.

S.M. Sze "Physics of Semiconductor Devices", 1981 Second Edition, pp. 362-369, Copyright by John Wiley & Sons, Inc., U.S.

(56) References Cited

OTHER PUBLICATIONS

W.P. Mulligan, et al. "A Flat-Plate Concentrator: Micro-Concentrator Design Overview", 2000, 3 sheets, Proceedings of the 28th IEEE PVSC.

K. R. McIntosh, et al. "The Choice of Silicon Wafer for the Production of Low-Cost Rear-Contact Solar Cells", May 2003, 4 sheets, Sunpower Corporation, Sunnyvale, CA.

P.J. Verlinden, et al. "Will We have a 20%-Efficient(PTC) Photovoltaic System?", 2001, 6 sheets, Proceedings of the 17th Europe Photovoltaic Solar Energy Conference.

William P. Mulligan, et al. "Development of Chip-Size Silicon Solar Cells", 2000, 6 sheets, Proceedings of the 28th IEEE PVSC.

Akira Terao, et al. "A Mirror-Less Design for Micro-Concentrator Modules", 2000, 4 sheets, Proceedings of the 28th IEEE PVSC.

P.J. Verlinden, et al. "Backside-Contact Silicon Solar Cells with Improved Efficiency for the '96 World Solar Challenge", 1997, 5 sheets, Proceedings of the 15th EPSEC.

PCT International Search Report and Written Opinion of the International Searching Authority for Application No. PCT/US2013/071402, 7 sheets, Apr. 14, 2014.

\* cited by examiner

CRACK RESISTANT SOLAR CELL MODULES

TECHNICAL FIELD

Embodiments of the subject matter described herein relate generally to solar cell modules. More particularly, embodiments of the subject matter relate to solar cell module structures and manufacturing processes.

BACKGROUND

Solar cells are well known devices for converting solar radiation to electrical energy. A solar cell has a front side that faces the sun during normal operation to collect solar radiation and a backside opposite the front side. Solar radiation impinging on the solar cell creates electrical charges that may be harnessed to power an external electrical circuit, such as a load.

Solar cells may be serially connected and packaged together to form a solar cell module. The packaging provides environmental protection for the solar cells. Prior to operation in the field, such as in a residential home, commercial structure, or photovoltaic power plant, solar cell modules may be subjected to rough handling during shipping, installation, and maintenance. Embodiments of the present invention pertain to solar cell modules with features that prevent cracks from developing on solar cells.

BRIEF SUMMARY

In one embodiment, a crack resistant solar cell module includes a protective package mounted on a frame. The protective package includes a polyolefin encapsulant that protectively encapsulates solar cells. The polyolefin has less than five weight percent of oxygen and nitrogen in the backbone or side chain. In other words, the combined weight percent of oxygen and nitrogen in any location in the molecular structure of the polyolefin is less than five. The polyolefin also has a complex viscosity less than 10,000 Pa second at 90° C. as measured by dynamic mechanical analysis (DMA) before any thermal processing (e.g., lamination) of the polyolefin. The protective package includes a top cover, the encapsulant, and a backsheet. The solar cell module allows for shipping, installation, and maintenance with less risk of developing cracks on the surfaces of the solar cells.

These and other features of the present invention will be readily apparent to persons of ordinary skill in the art upon reading the entirety of this disclosure, which includes the accompanying drawings and claims.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures. The figures are not drawn to scale.

DETAILED DESCRIPTION

In the present disclosure, numerous specific details are provided, such as examples of components, materials, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1:
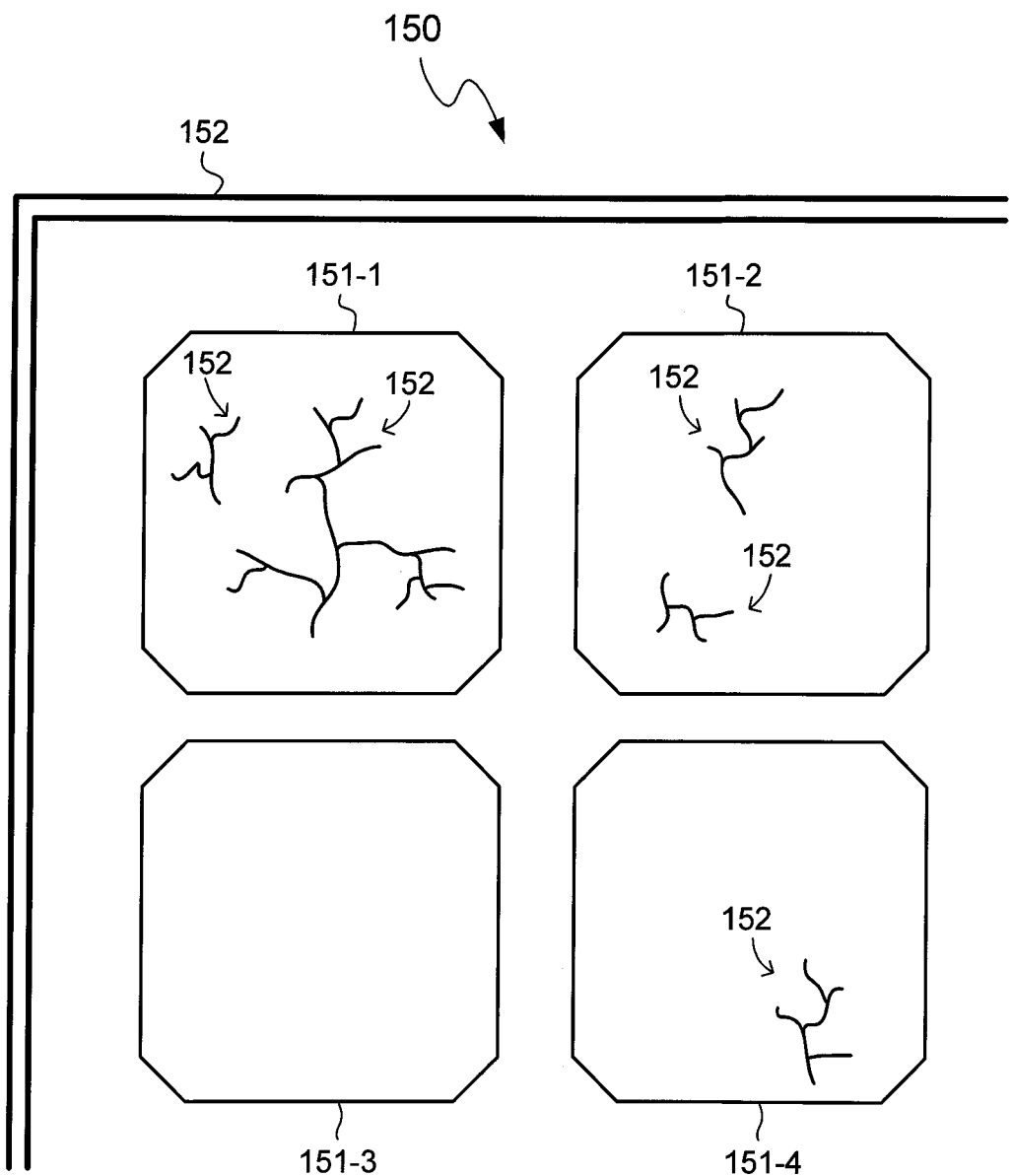
FIG. 1 schematically shows a plan view of a portion of an example solar cell module with fern cracks.

FIG. 1 schematically shows a plan view of a portion of an example solar cell module 150 with fern cracks. The solar cell module 150 includes a plurality of solar cells 151 (i.e., 151-1, 151-2, 151-3, 151-4, etc.) that are mounted on a frame 152. There are many solar cell modules 151 in the solar cell module 150, but only some in the upper left corner are shown for clarity of illustration.

In general, solar cell modules are shipped from their source, such as a warehouse or factory, to the job site where the solar cell modules will be installed and operated. The solar cell modules may be subjected to rough handling as they are loaded and unloaded during shipment. At the job site, the solar cell modules may be subjected to further rough handling before or during installation and during maintenance. For example, prior to installation, the solar cell modules may be left on the floor where they may be stepped on by installers and other workers. Some installers may also ignore proper handling instructions.

In the example of FIG. 1, some of the solar cells 151 have fern cracks 152. The fern cracks 152 may be caused by rough handling and repeated mechanical stress in the field. The fern cracks 152 are so named because they usually, but not necessarily, branch out and extend on the surface of the damaged solar cell 151. In the example of FIG. 1, the solar cells 151-1, 151-2, and 151-4 (but not the solar cell 151-3) have fern cracks 152. The fern cracks 152 may induce hot solar cells and may result in power loss.

Figure 2:
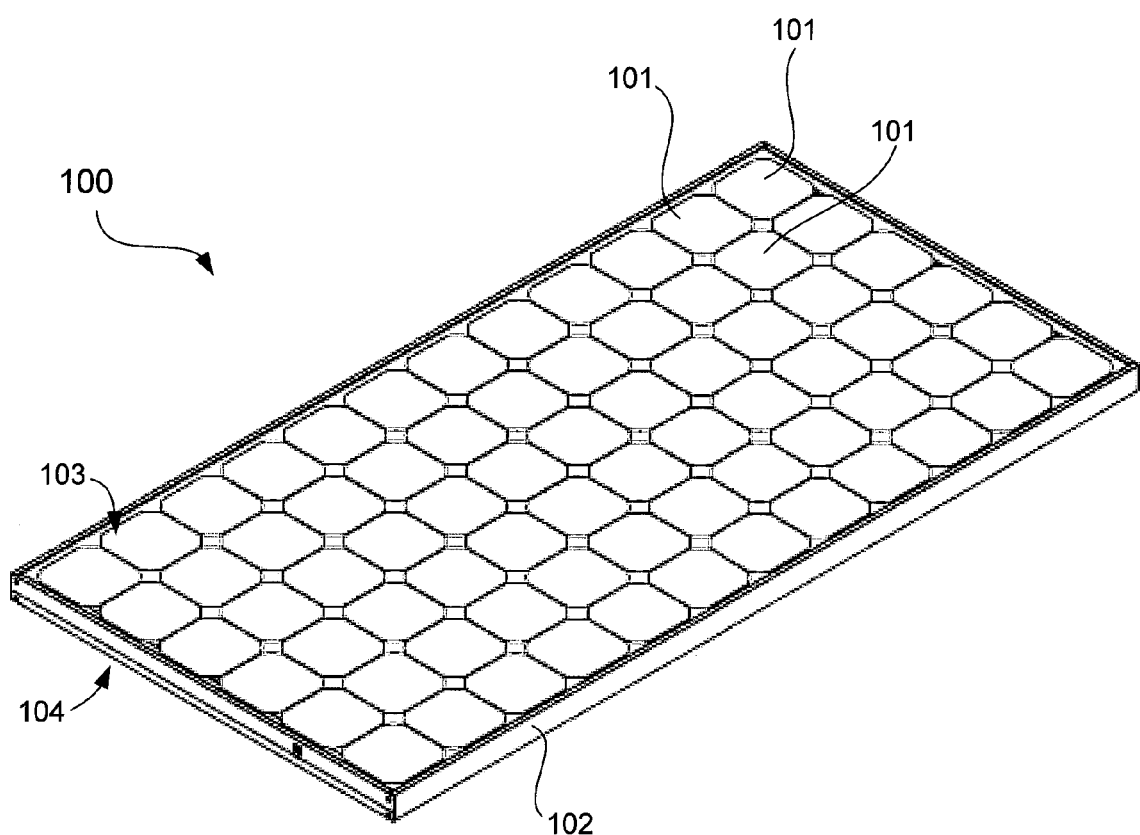
FIG. 2 shows a perspective view of a solar cell module in accordance with an embodiment of the present invention.

Referring now to FIG. 2, there is shown a perspective view of a solar cell module 100 in accordance with an embodiment of the present invention. The solar cell module 100 is a so-called "terrestrial solar cell module" in that it is designed for use in stationary applications, such as on rooftops or by photovoltaic power plants. In the example of FIG. 2, the solar cell module 100 includes an array of interconnected solar cells 101. Only some of the solar cells 101 are labeled in FIG. 2 for clarity of illustration. In the example of FIG. 2, the solar cells 101 comprise backside contact solar cells. In a backside contact solar cell, all diffusion regions and metal contacts coupled to the diffusion regions are formed on the backside of the solar cell. That is, both the P-type and N-type diffusion regions and metal contacts coupled to them are on the backside of the solar cell. In other embodiments, the solar cells 101 comprise front contact solar cells where one polarity of diffusion regions (e.g., N-type diffusion regions) are on the front side of the solar cells, and the opposite polarity of diffusion regions (e.g., P-type diffusion regions) are on the backside of the solar cells.

Visible in FIG. 2 are the front sides of the solar cells 101. The front sides of the solar cells 101 are also referred to as the "sun side" because they face towards the sun during normal operation. The backsides of the solar cells 101 are opposite the front sides. A frame 102 provides mechanical support for the solar cells 101. The front portion 103 of the solar cell module 100 is on the same side as the front sides of the solar cells 101 and is visible in FIG. 2. The back portion 104 of the solar cell module 100 is under the front portion 103. The back portion 104 of the solar cell module 100 is on the same side as the backsides of the solar cells 101.

Figure 3:
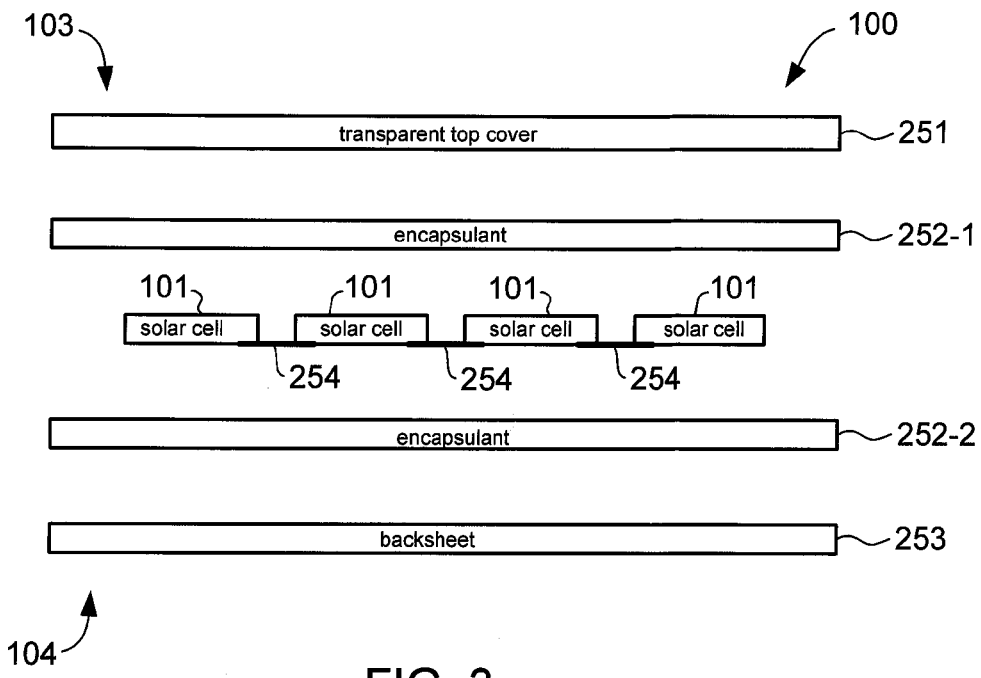
FIGS. 3-5 are cross-sectional views schematically illustrating a method of making a solar cell module in accordance with an embodiment of the present invention.
Figure 4:
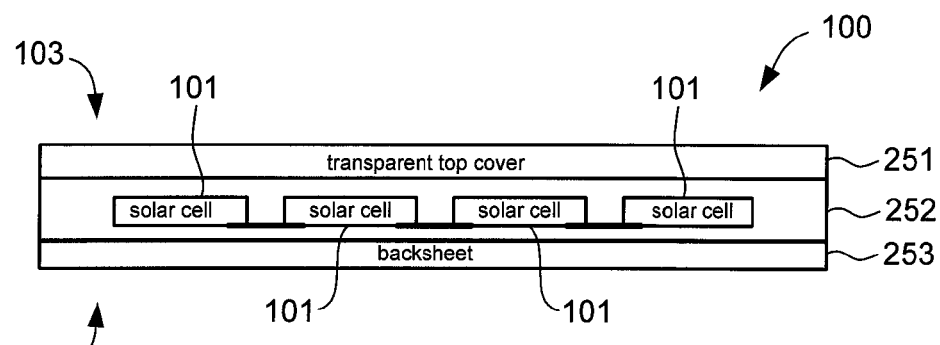
Figure 5:
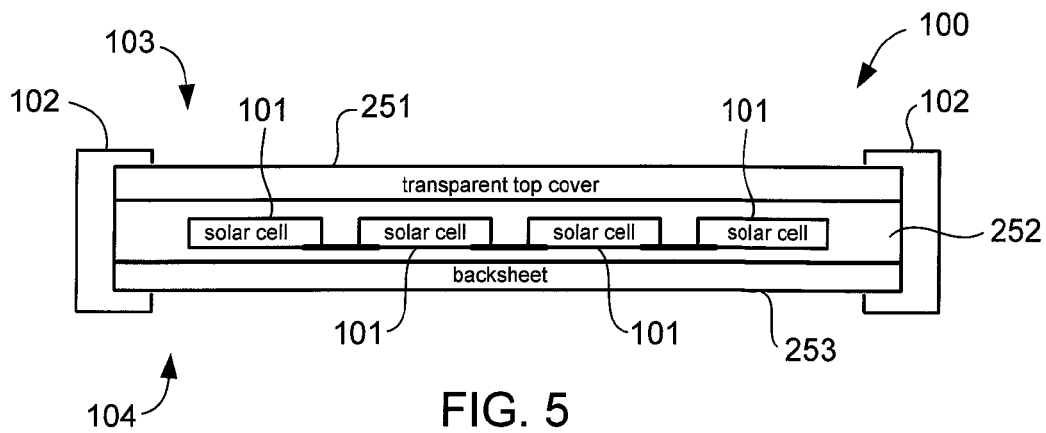

FIGS. 3-5 are cross-sectional views schematically illustrating a method of making a solar cell module 100 in accordance with an embodiment of the present invention.

FIG. 3 is an exploded view showing the components of the solar cell module 100 in accordance with an embodiment of the present invention. The solar cell module 100 may comprise a transparent top cover 251, sheets of encapsulant 252, the solar cells 101, interconnects 254, and a backsheet 253. The sheet of encapsulant 252 on the front portion 103 is labeled as "252-1" and the sheet of encapsulant 252 on the back portion 104 is labeled as "252-2." The transparent top cover 251 and the front side encapsulant 252-1 serve as front side packaging components, and the backside encapsulant 252-2 and the backsheet 253 serve as backside packaging components. In the example of FIG. 3, the transparent top cover 251 is the outermost front side packaging component and the backsheet 253 is the outermost backside packaging component.

The transparent top cover 251 and the encapsulant 252 comprise optically transparent materials. The transparent top cover 251, which is the topmost layer on the front portion 103, protects the solar cells 101 from the environment. The solar cell module 100 is installed in the field such that the transparent top cover 251 faces the sun during normal operation. The front sides of the solar cells 101 face towards the sun by way of the transparent top cover 101. In the example of FIG. 3, the transparent top cover 201 comprises glass (e.g., 3.2 mm thick, soda lime glass).

The encapsulant 252 protectively encapsulates the solar cells 101. The inventors discovered that there is a correlation between fern cracks and the type of encapsulant employed. At the material level, the inventors also discovered that the viscosity of the encapsulant is critical to control the degree or severity of the fern crack. These discoveries are unexpected in that the characteristics of the encapsulant, instead of the solar cells themselves, need to be addressed to mitigate fern cracks on the solar cells. In embodiments of the present invention, the characteristics of the encapsulant 252 are optimized to reduce occurrence of fern cracks on the solar cells 101.

In one embodiment, the encapsulant 252 comprises polyolefin. Examples of suitable polyolefin include polyethylene, high density polyethylene, low density polyethylene, linear low density polyethylene, and polypropylene. In one embodiment, to guard against fern cracks, the encapsulant 252 comprises polyolefin that has less than 5 weight percent of oxygen and nitrogen in the backbone or side chain. In other words, the combined weight percent of oxygen and nitrogen in any location in the molecular structure of the polyolefin is less than five. In one embodiment, the polyolefin further has a complex viscosity less than 10,000 Pa-s (Pascal second) at 90° C. as measured by dynamic mechanical analysis (DMA) before lamination or any other thermal processing. The volume resistivity of the polyolefin of the encapsulant 252 is preferably at least $10^{15}$ Ohm-cm as measured by ASTM D257 test at 1 kV, 10 min electrification, and 60° C. As is well known, ASTM D257 is a standard by ASTM International, which is formerly known as the American Society for Testing and Materials.

The interconnects 254 may comprise a metal for electrically interconnecting the solar cells 101. In the example of FIG. 3, the solar cells 101 comprise serially-connected backside contact solar cells, and the interconnects 254 electrically connect to corresponding P-type and N-type diffusion regions on the backsides of the solar cells 101. The solar cells 101 may also comprise serially-connected front contact solar cells, in which case the interconnects 254 would connect to diffusion regions on the backside and front side of the solar cells.

The backsides of the solar cells 101 face the backsheet 253. The backsheet 253 may be any single layer or multiple layers of materials that provide environmental protection to other components of the solar cell module 100. For example, flouropolymer, polyvinylidene fluoride, polytetrafluoroethylene, polypropylene, polyphenylene sulfide, polyester, polycarbonate, or polyphenylene oxide may be used as a single layer or as part of multiple layers of backsheet. The backsheet 253 is on the back portion 104.

In one embodiment, the transparent top cover 251, the encapsulant 252-1 on the front side, the solar cells 101 electrically connected by the interconnects 254, the encapsulant 252-2 on the backside, and the backsheet 253 are formed together to create a protective package. This is illustrated in FIG. 4, where the aforementioned components are formed together in the stacking order of FIG. 3. More particularly, the solar cells 101 are placed between the encapsulants 252-1 and 252-2, the backsheet 253 is placed under the encapsulant 252-2, and the transparent top cover 251 is placed over the encapsulant 252-1. The just mentioned components are then pressed and heated together by vacuum lamination, for example. The lamination process melts together the sheet of encapsulant 252-1 and the sheet of encapsulant 252-2 to encapsulate the solar cells 101. In FIG. 4, the encapsulant 252-1 and the encapsulant 252-2 are simply labeled as "252" to indicate that that they have been melted together.

FIG. 5 shows the protective package of FIG. 4 mounted on the frame 102. Being encapsulated in the encapsulant 252, the solar cells 101 are electrically isolated from the frame 102.

Tables 1, 2, and 3 discussed below show the effectiveness of the above disclosed encapsulants in preventing fern cracks.

Table 1 shows the complex viscosity of various polyolefin encapsulants (Sample 1, Sample 2, Sample 3, and Sample 4) at various temperatures measured at 1/s shear rate by dynamic mechanical analysis. Table 1 shows complex viscosity in Pascal second (Pa-s). The viscosities were measured before any thermal processing of the encapsulants, which in this example is before lamination.

TABLE 1

| Temperature (° C.) | Sample 1 | Sample 2 | Sample 3 | Sample 4 |
|---|---|---|---|---|
| 50 | 7.0E+04 | 8.3E+04 | 9.5E+04 | 8.4E+04 |
| 90 | 2.9E+04 | 4.1E+04 | 2.4E+03 | 7.3E+03 |
| 130 | 1.6E+04 | 4.7E+03 | 1.6E+03 | 2.3E+03 |
| 140 | 1.5E+04 | 4.3E+03 | 1.5E+03 | 2.3E+03 |
| 150 | 1.3E+04 | 3.3E+03 | 1.5E+03 | 2.3E+03 |

As shown in Table 1, the polyolefin encapsulants referred to as "Sample 3" and "Sample 4" have a complex viscosity less than 10,000 Pa-s at 90° C. Samples 3 and 4 have the characteristics of encapsulants in accordance with embodiments of the present invention. The polyolefin encapsulants referred to as "Sample 1" and "Sample 2" have complex viscosities greater than 10,000 Pa-s at 90° C., and therefore do not have the characteristics for preventing fern cracks.

Table 2 shows the relative probability of developing fern cracks on the solar cells when using the above-noted samples of polyolefin encapsulants. More particularly, as noted in Table 2, studies performed by the inventors indicate that solar cells encapsulated by Sample 1 are four times more likely to develop cracks compared to solar cells encapsulated by Sample 3. Similarly, solar cells encapsulated by Sample 2 are three times more likely to develop cracks compared to solar cells encapsulated by Sample 3.

TABLE 2

|  | Relative Probability of Cracking Cell |
|---|---|
| Sample 1 | 4x |
| Sample 2 | 3x |
| Sample 3 | 1x (baseline) |

Table 3 shows relative power degradation of solar cells encapsulated by Sample 2, Sample 3, and Sample 4 in a stress test where a person stepped on the solar cell modules. The stress test simulates foot traffic during installation or cleaning process in the field. A person weighing 85 kg stepped on all of the solar cells of the module in the first test. In a second test, a person weighing 120 kg stepped on all of the solar cells of the module.

TABLE 3

|  | Relative power degradation for 85 kg person stepping on solar cell module | Relative power degradation for 120 kg person stepping on solar cell module |
|---|---|---|
| Sample 2 | 5.7x | 15x |
| Sample 3 | 1x (baseline) | 1x (baseline) |
| Sample 4 | 0.6x | 0.6x |

As shown in Table 3, solar cells encapsulated by Sample 2 exhibited much higher power degradation compared to solar cells encapsulated by either Sample 3 or Sample 4. The difference in relative power degradation of the solar cells increased when a heavier person walked on the solar cell modules.

Figure 6:
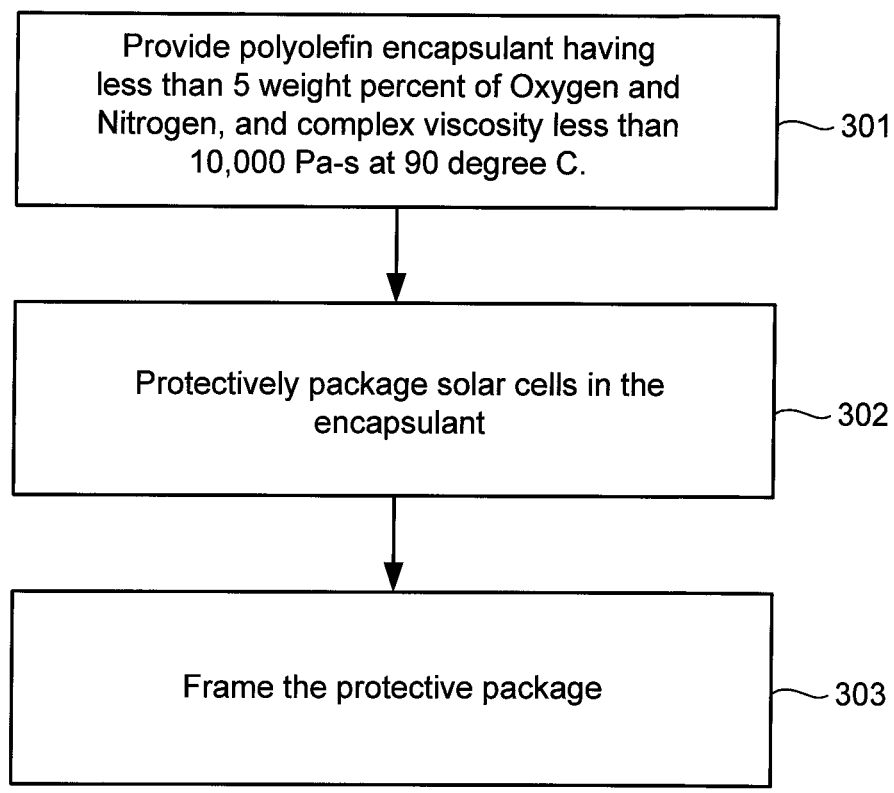
FIG. 6 shows a flow diagram of a method manufacturing a solar cell module in accordance with an embodiment of the present invention.

FIG. 6 shows a flow diagram of a method of manufacturing a solar cell module in accordance with an embodiment of the present invention. The method of FIG. 6 includes providing an encapsulant for a solar cell module (step 301). In one embodiment, the encapsulant comprises polyolefin having less than five weight percent of oxygen and nitrogen in the backbone or side chain, and having a complex viscosity that is less than 10,000 Pascal second at 90° C. as measured by dynamic mechanical analysis before lamination or any thermal processing. The polyolefin encapsulant may also have a volume resistivity of at least $10^{15}$ Ohm-cm as measured by ASTM D257 test at 1 kV, 10 min. electrification, and 60° C.

Solar cells to be included in the solar cell module are protectively packaged in the encapsulant (step 302). In one embodiment, the solar cells are placed between sheets (e.g., a bottom sheet and a top sheet) of the encapsulant, a backsheet is placed under a bottom sheet of the encapsulant, and a transparent top cover is placed over a top sheet of the encapsulant. The transparent top cover, the solar cells sandwiched by the sheets of the encapsulant, and the backsheet are then pressed and heated together by vacuum lamination, for example. The resulting protective package is then mounted on a frame (step 303). The manufactured solar cell module is resistant to fern cracks, reducing the chance of damaging the solar cells contained therein during shipping, installation, and maintenance.

Crack resistant solar cell modules and method of manufacturing same have been disclosed. While specific embodiments of the present invention have been provided, it is to be understood that these embodiments are for illustration purposes and not limiting. Many additional embodiments will be apparent to persons of ordinary skill in the art reading this disclosure.

What is claimed is:

1. A solar cell module comprising:
a plurality of solar cells;
an encapsulant encapsulating the plurality of solar cells, the encapsulant comprising polyolefin having less than 5 weight percent oxygen and nitrogen in a backbone or side chain, the polyolefin having a complex viscosity less than 10,000 Pa-s at 90° C. as measured by dynamic mechanical analysis before any thermal processing of the encapsulant;
a transparent top cover on a front portion of the solar cell module, the front portion facing the sun during normal operation; and
a backsheet on a back portion of the solar cell module,
wherein the polyolefin comprises polyethylene.

2. The solar cell module of claim 1 wherein the polyolefin has a volume resistivity of at least $10^{15}$ Ohm-cm as measured by ASTM D257 test at 1 kV, 10 min electrification, and 60° C.

3. The solar cell module of claim 1 further comprising:
a frame, and wherein the transparent top cover, the encapsulant encapsulating the plurality of solar cells, and the backsheet are mounted on the frame.

4. The solar cell module of claim 3 wherein the plurality of solar cells are electrically isolated from the frame.

5. The solar cell module of claim 1 wherein the plurality of solar cells comprises backside contact solar cells.

6. A solar cell module comprising:
a plurality of solar cells;
a protective package comprising an encapsulant that encapsulates the plurality of solar cells, the encapsulant comprising polyolefin having less than 5 weight percent oxygen and nitrogen in a backbone or side chain; and
a frame on which the protective packaging is mounted,
wherein the polyolefin comprises polyethylene.

7. The solar cell module of claim 6 wherein the polyolefin has a complex viscosity less than 10,000 Pa-s at 90° C. as measured by dynamic mechanical analysis before any thermal processing of the encapsulant.

8. The solar cell module of claim 6 wherein the polyolefin has a volume resistivity of at least $10^{15}$ Ohm-cm as measured by ASTM D257 test at 1 kV, 10 min electrification, and 60° C.

9. The solar cell module of claim 6 wherein the protective packaging comprises:
a transparent top cover;
the encapsulant encapsulating the plurality of solar cells; and
a backsheet.

10. A solar cell module comprising:
a plurality of solar cells;
an encapsulant encapsulating the plurality of solar cells, the encapsulant comprising polyolefin having less than 5 weight percent oxygen and nitrogen in a backbone or side chain, the polyolefin having a complex viscosity less than 10,000 Pa-s at 90° C. as measured by dynamic mechanical analysis before any thermal processing of the encapsulant;
a transparent top cover on a front portion of the solar cell module, the front portion facing the sun during normal operation; and
a backsheet on a back portion of the solar cell module,
wherein the polyolefin comprises polypropylene.

11. The solar cell module of claim 10 wherein the polyolefin has a volume resistivity of at least $10^{15}$ Ohm-cm as measured by ASTM D257 test at 1 kV, 10 min electrification, and 60° C.

12. The solar cell module of claim 10 further comprising:
a frame, and wherein the transparent top cover, the encapsulant encapsulating the plurality of solar cells, and the backsheet are mounted on the frame.

13. The solar cell module of claim 12 wherein the plurality of solar cells are electrically isolated from the frame.

14. The solar cell module of claim 10 wherein the plurality of solar cells comprises backside contact solar cells.

15. A solar cell module comprising:
a plurality of solar cells;
a protective package comprising an encapsulant that encapsulates the plurality of solar cells, the encapsulant comprising polyolefin having less than 5 weight percent oxygen and nitrogen in a backbone or side chain; and
a frame on which the protective packaging is mounted, wherein the polyolefin comprises polypropylene.

16. The solar cell module of claim 15 wherein the polyolefin has a complex viscosity less than 10,000 Pa-s at 90° C. as measured by dynamic mechanical analysis before any thermal processing of the encapsulant.

17. The solar cell module of claim 15 wherein the polyolefin has a volume resistivity of at least $10^{15}$ Ohm-cm as measured by ASTM D257 test at 1 kV, 10 min electrification, and 60° C.

18. The solar cell module of claim 15 wherein the protective packaging comprises:
a transparent top cover;
the encapsulant encapsulating the plurality of solar cells; and
a backsheet.

* * * * *